United States Patent
Takeuchi

(10) Patent No.: US 8,976,590 B2
(45) Date of Patent: Mar. 10, 2015

(54) SEMICONDUCTOR MEMORY DEVICE

(71) Applicant: Fujitsu Semiconductor Limited, Yokohama-shi, Kanagawa (JP)

(72) Inventor: Atsushi Takeuchi, Akiruno (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/971,496

(22) Filed: Aug. 20, 2013

(65) Prior Publication Data
US 2014/0085981 A1 Mar. 27, 2014

(30) Foreign Application Priority Data
Sep. 25, 2012 (JP) .................. 2012-211195

(51) Int. Cl.
*G11C 16/04* (2006.01)
*G11C 16/10* (2006.01)
(52) U.S. Cl.
CPC ....................... *G11C 16/10* (2013.01)
USPC ............ 365/185.12; 365/185.18; 365/185.03; 365/185.11; 365/185.33; 365/195
(58) Field of Classification Search
CPC .............. G11C 16/0483; G11C 16/10; G11C 16/3454; G11C 16/04; G11C 16/06; G11C 16/3459; G11C 16/16
USPC ............ 365/185.18, 185.03, 185.11, 185.33, 365/195
See application file for complete search history.

(56) References Cited

U.S. PATENT DOCUMENTS

| 5,844,843 A | 12/1998 | Matsubara et al. |
| 2011/0188310 A1* | 8/2011 | Kim .......................... 365/185.11 |

FOREIGN PATENT DOCUMENTS

| JP | 05-266220 A | 10/1993 |
| JP | 06-314495 A | 11/1994 |

* cited by examiner

*Primary Examiner* — Thong Q Le
(74) *Attorney, Agent, or Firm* — Arent Fox LLP

(57) ABSTRACT

A semiconductor memory device includes a memory block as a code storage memory area which has a large memory capacity and in which the number of bits to be written at once is large, and a memory block as a work memory area which has a small memory capacity and in which the number of bits to be written at once is small, in which in writing to the code storage memory area a first voltage is supplied to a source line of this memory block, and in writing to the work memory area a second voltage higher than the first voltage is supplied to a source line of this memory block.

18 Claims, 16 Drawing Sheets

|  | BA<0> | SRC0 | SRC1 |
|---|---|---|---|
| PROG | 0 | VST (2.4V) | VSB (1.8V) |
|  | 1 | VSB (1.8V) | VSB (1.8V) |
| ERASE | 0 | VST (9V) | VSB (1.8V) |
|  | 1 | VSB (1.8V) | VST (9V) |
| READ | * | VSB (1.8V) | VSB (1.8V) |

F I G. 7
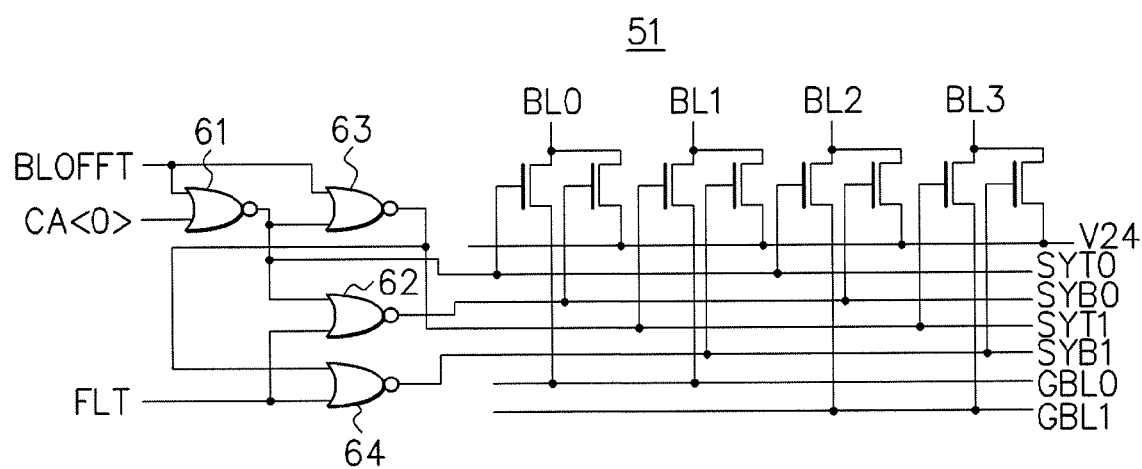

F I G. 8
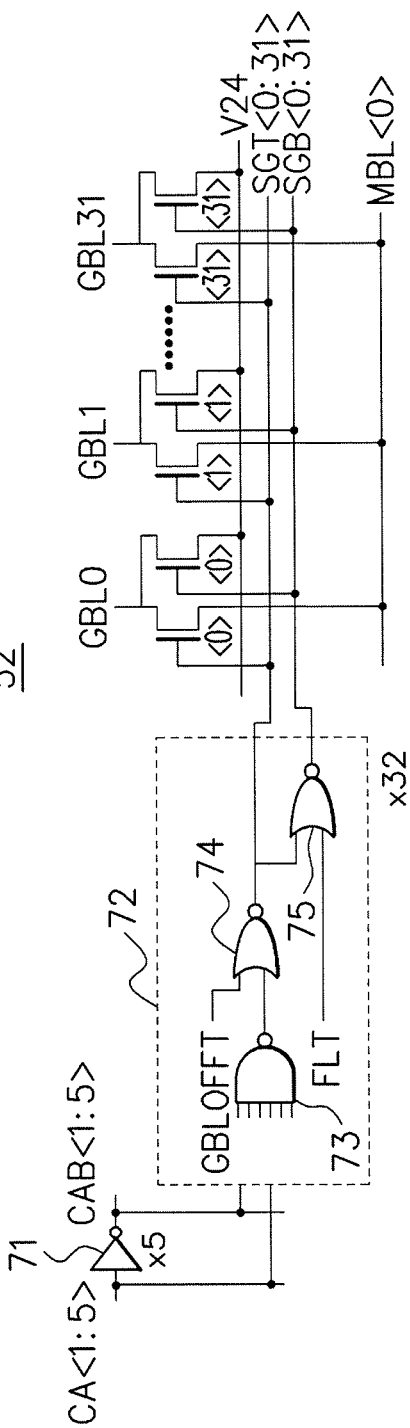

F I G. 11

| STATE/SIGNAL | DLRSTT | DLCONT | DLTRNT | VDBSS |
|---|---|---|---|---|
| STANDBY | L | L | L | VSS |
| RESET | H | L | L | VSS |
| LATCH WRITE | L | L | H | VSS |
| LATCH READ | L | H | L | V18 |
| PROGRAM | L | H | L | V18 |

F I G. 14
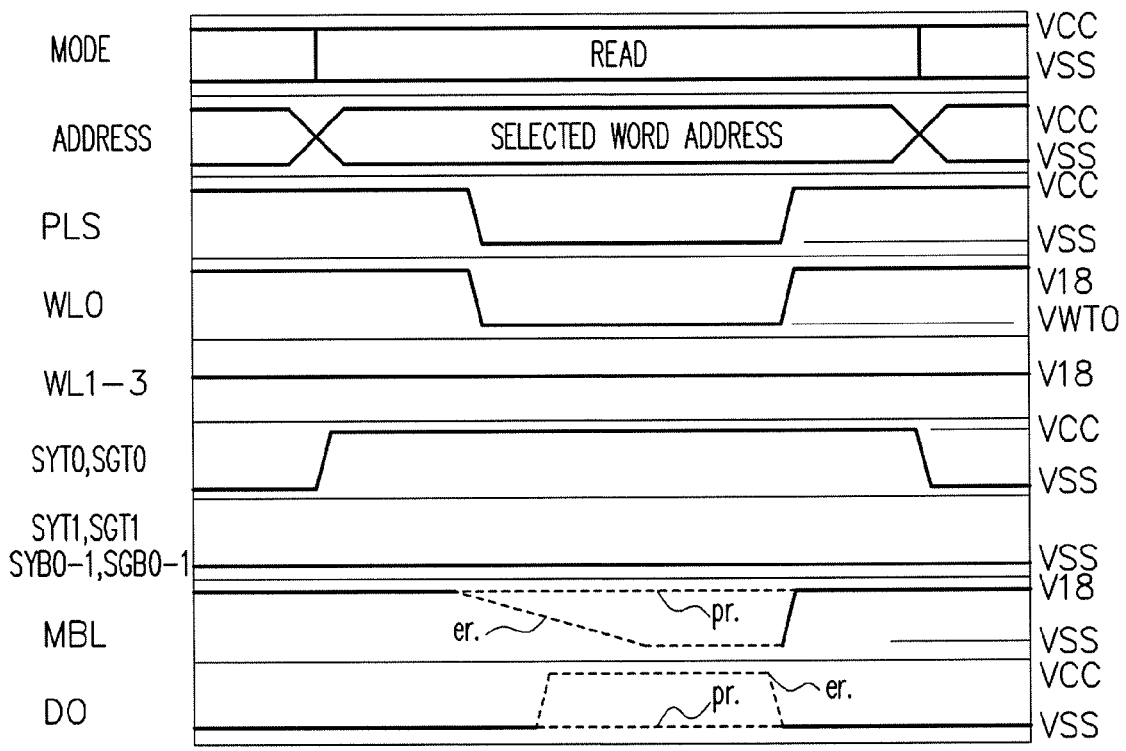
F I G. 15
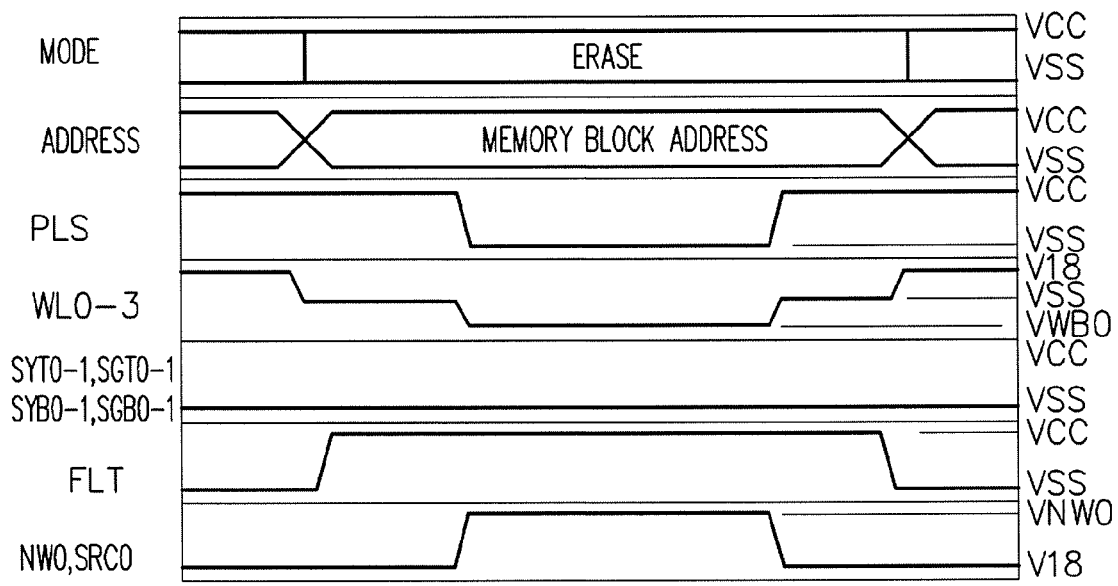

F I G. 16
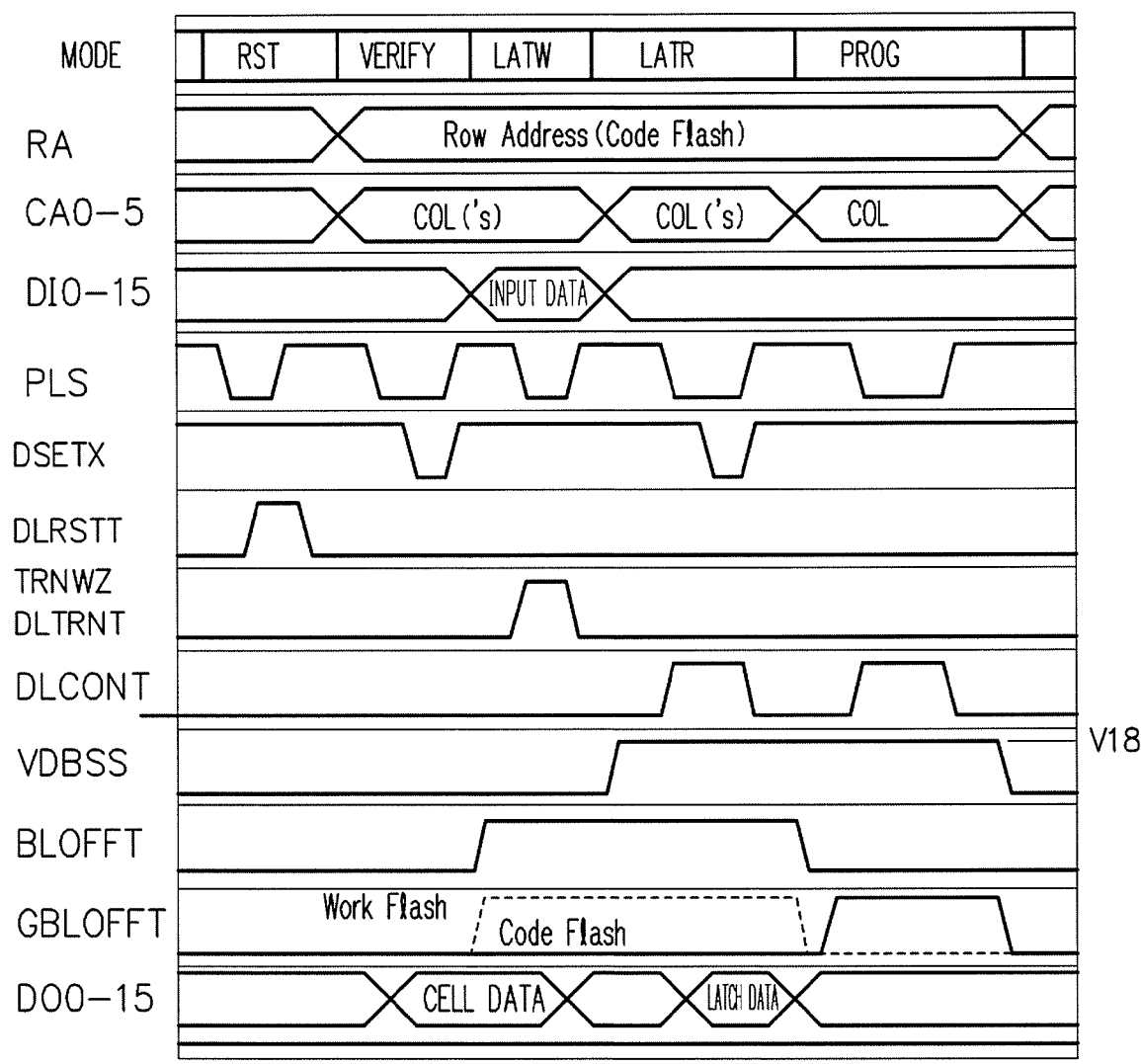

FIG. 20
|     |              | READ   | ERASE | PROGRAM |
|-----|--------------|--------|-------|---------|
| WL  | SELECTED     | −3V    | −9V   | 9V      |
|     | NON-SELECTED | 1.8V   | —     | 0V      |
| BL  | SELECTED     | 0~1.8V | HiZ   | 0V      |
|     | NON-SELECTED | HiZ    | HiZ   | 2.4V    |
| SRC |              | 1.8V   | 9V    | 1.8V    |
| NW  |              | 1.8V   | 9V    | 5V      |
FIG. 21
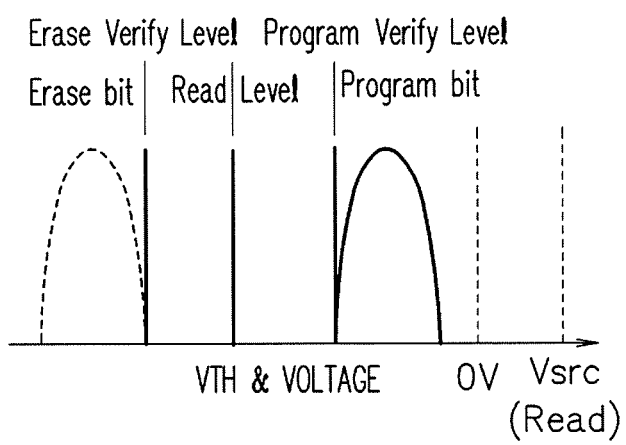
FIG. 22
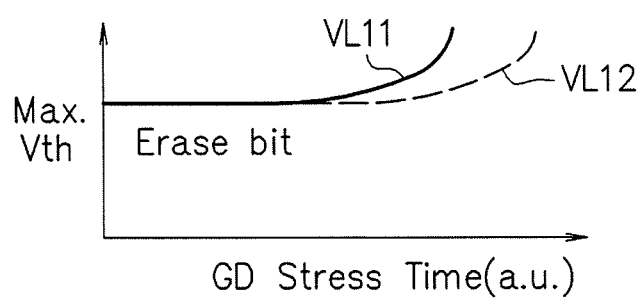

F I G. 23
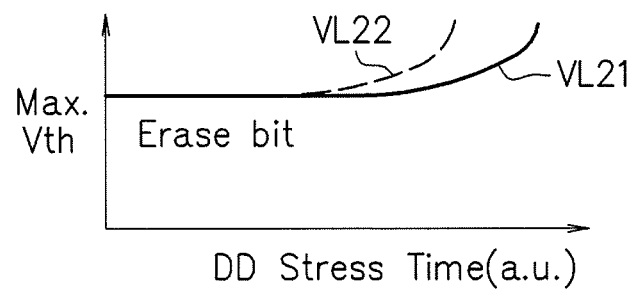

SEMICONDUCTOR MEMORY DEVICE

CROSS-REFERENCE TO RELATED APPLICATION

This application is based upon and claims the benefit of priority of the prior Japanese Patent Application No. 2012-211195, filed on Sep. 25, 2012, the entire contents of which are incorporated herein by reference.

FIELD

The embodiment discussed herein is directed to a semiconductor memory device.

BACKGROUND

In flash memories which are electrically rewritable nonvolatile semiconductor memory devices, N-channel type memory cells are mainly used. The N-channel type memory cells perform writing by injecting channel hot electrons, and thus their reliability decreases as the miniaturization thereof proceeds. Accordingly, use of P-channel type memory cells is considered as an alternative technology.

FIG. 19 is a diagram illustrating a structural example of a memory cell array using P-channel type memory cells. FIG. 20 is a diagram illustrating an example of voltage setting in each operation in the semiconductor memory device having the P-channel type memory cells. In a read operation, −3 V is applied to a selected word line WL, 1.8 V is applied to a non-selected word line WL, 1.8 V is applied to a source line SRC, and 1.8 V is applied to an N-type well NW. In an erase operation, −9 V is applied to each word line WL of the block (sector) to be erased at once, 9 V is applied to the source line SRC, and 9 V is applied to the N-type well NW. Note that in the erase operation, bit lines BL of the block (sector) to be erased are in a high impedance (HiZ) state. In a program operation, 9 V is applied to a selected word line WL, 0 V is applied to a non-selected word line WL, 1.8 V is applied to the source line SRC, and 5 V is applied to the N-type well NW. Further, in the program operation, 0 V is applied to a bit line BL connected to memory cells to be written, and 2.4 V is applied to a bit line BL connected to memory cells which are not to be written.

Thus, for the memory cells of P-channel type, there is known a method to perform writing by injecting hot electrons generated by inter-band tunneling in the vicinity of the drain by applying a voltage to the N-type well and the gate. For example, as illustrated in FIG. 19, when writing to a memory cell 111 having a gate connected to a word line WLA and a drain connected to a bit line BLA is performed, a voltage Vwla to be applied to the selected word line WLA is 9 V, and a voltage Vbla to be applied to the selected bit line BLA is 0 V. Further, a voltage Vwlb to be applied to the non-selected word line WLB is 0 V, and a voltage Vblb to be applied to the non-selected bit line BLB is 2.4 V. Note that a source voltage Vs to be applied to the sources of the respective transistors of the memory cells 111, 112, 113, 114 is 1.8 V, and a voltage Nwell to be applied to the N-type well is 5 V.

By performing the erase operation and the program operation by applying voltages as illustrated in FIG. 20, the threshold voltages of the P-channel type memory cells are controlled as illustrated in FIG. 21. The threshold voltage of a memory cell with a bit in a program state is higher than the threshold voltage of a memory cell with a bit in an erase state. The threshold voltage of the memory cell with a bit in a program state is higher than a program verify level, and the threshold voltage of the memory cell with a bit in an erase state is lower than an erase verify level. In the read operation, whether the data stored in a memory cell is 0 or 1 is judged by judging whether the threshold voltage of the memory cell is higher or lower than a read level set between the program verify level and the erase verify level.

There has been disclosed a technology to divide a storage area into plural blocks in a flash memory, the sources of memory cells are connected in common in every block, and a source voltage is given thereto (see, for example, Patent Documents 1, 2). There has also been disclosed a technique to change the source voltage depending on whether it is a selected block or a non-selected block (see, for example, Patent Document 1).

[Patent Document 1] Japanese Laid-open Patent Publication No. 06-314495

[Patent Document 2] Japanese Laid-open Patent Publication No. 05-266220

When the P-channel type memory cells are used and writing is performed by applying a voltage to the N-type well and the gate as described above, memory cells connected to the same bit line as the memory cell to be written as well as memory cells connected to the same word line thereof suffer disturbance during the writing. In the example illustrated in FIG. 19, the other memory cell 112 connected to the word line WLA to which the memory cell 111 to be written is connected suffers gate disturb. The other memory cell 113 connected to the bit line BLA to which the memory cell 111 to be written is connected suffers drain disturb.

FIG. 22 is a diagram illustrating a change in the threshold voltage of a memory cell due to the gate disturb. FIG. 23 is a diagram illustrating a change in the threshold voltage of a memory cell due to the drain disturb. In FIG. 22 and FIG. 23, the horizontal axis indicates the time in which the transistor of the memory cell suffers the gate disturb or the drain disturb, and the vertical axis indicates the maximum threshold voltage in a threshold distribution of memory cells with a bit in an erase state.

As illustrated in FIG. 22, in the memory cell, when the time of suffering the gate disturb becomes long, there occurs a shift in the threshold voltage of the memory cell due to the gate disturb, and the threshold voltage increases. As illustrated in FIG. 23, in the memory cell, when the time of suffering the drain disturb becomes long, there occurs a shift in the threshold voltage of the memory cell due to the drain disturb, and the threshold voltage increases. When the threshold voltage of the memory cell with a bit in an erase state becomes too high, there arises a possibility that it is judged as a bit in a program state during reading.

Here, by increasing the source voltage during the program operation, the change of the threshold voltage of the memory cell due to the gate disturb becomes, for example, as illustrated from a solid line VL11 to a dashed line VL12, and the time until the threshold voltage begins to increase becomes long. That is, resistance to the gate disturb improves. However, when the source voltage is increased during the program operation, in other memory cells connected to the same bit line as the memory cell to be written, leak currents from the sources of the memory cell transistors to the bit line increase.

SUMMARY

One aspect of a semiconductor memory device includes a write circuit which selects P number of memory cells and performs writing at once in writing of a first block which has a plurality of first bit lines to each of which M number of memory cells are connected and selects Q number of memory cells (P>Q) and performs writing at once in writing of a second block which has a plurality of second bit lines to each of which N number of memory cells (M>N) are connected; and a source line control circuit which supplies a first voltage to a source line of the first block in writing of the first block and supplies a second voltage different from the first voltage to a source line of the second block in writing of the second block.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is a diagram illustrating a structural example of a bit line selecting circuit in this embodiment;

FIG. 8 is a diagram illustrating a structural example of a global bit line selecting circuit in this embodiment;

FIG. 11 is a diagram illustrating an example of states of a latch control signal in this embodiment;

FIG. 14 is a waveform chart illustrating an example of a read operation in the semiconductor memory device in this embodiment;

FIG. 15 is a waveform chart illustrating an example of an erase operation in the semiconductor memory device in this embodiment;

FIG. 16 is a waveform chart illustrating an example of a program operation in the semiconductor memory device in this embodiment;

FIG. 20 is a diagram illustrating an example of voltage setting in each operation in a semiconductor memory device having P-channel type memory cells;

FIG. 21 is a diagram illustrating an example of a threshold voltage distribution in the P-channel type memory cells;

FIG. 22 is a diagram illustrating a change in the threshold voltage of a memory cell due to gate disturb; and FIG. 23 is a diagram illustrating a change in the threshold voltage of a memory cell due to drain disturb.

DESCRIPTION OF EMBODIMENT

Figure 1:
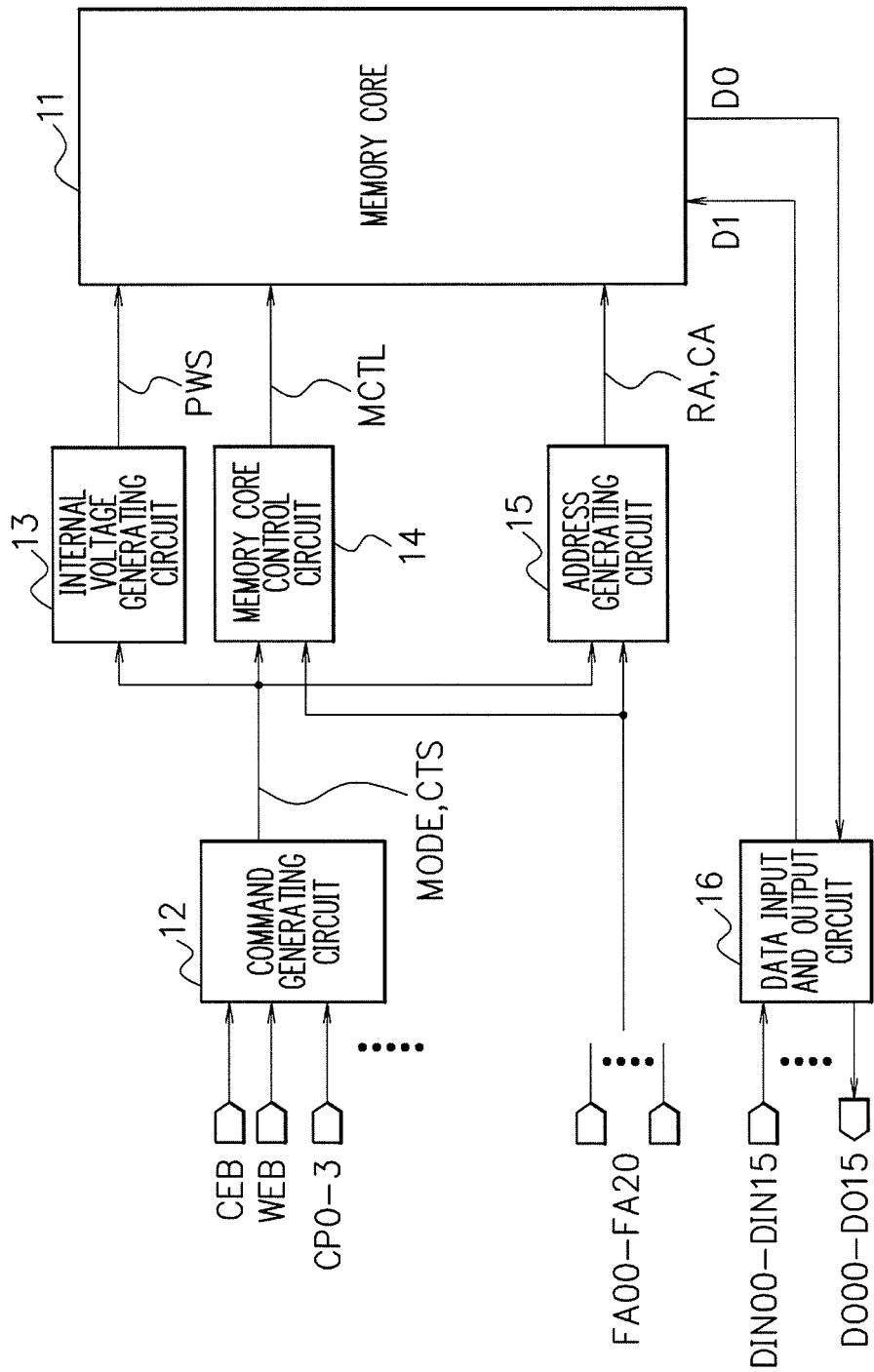
FIG. 1 is a diagram illustrating a structural example of a semiconductor memory device in an embodiment.

Hereinafter, an embodiment will be described based on the drawings.

A flash memory which is an electrically rewritable non-volatile semiconductor memory device normally has a plurality of memory blocks (sectors). A plurality of memory cells included in a memory block (sector) are located in the same well, and the data therein are erased at once. The plurality of memory blocks can be categorized into two types: a memory block as a code storage memory area for storing control codes, and a memory block as a work memory area for storing work data depending on their purposes. In the code storage memory area, it is desired that the memory capacity and the number of bits to be written at once (program page size) are large, and the read speed and the write (program) speed are high. On the other hand, in the work memory area, it is desired that the memory capacity and the program page size are small, and the read speed and the write (program) speed may be low.

In the memory block as the work memory area, since the program page size is small, the number of writes (number of pages) per one word line increases, and the time for the memory cells to suffer gate disturb becomes long. Accordingly, a shift of the threshold voltage of memory cells due to the gate disturb occurs, and the threshold voltage changes easily. As already described, the change in the threshold voltage of memory cells due to gate disturb improves by increasing the source voltage during a program operation, and the time until the threshold voltage begins to increase becomes long. However, when the source voltage is increased during a program operation, in the other memory cells connected to the same bit line as the memory cell to be written, leak currents from the sources of the memory cell transistors to the bit line increase.

Here, in the memory block as the work memory area, since the memory capacity is small, the number of memory cells connected to one bit line, that is, the number of memory cells per bit line (cells/BL) is small. In the memory block as the work memory area, since the program page size is small, the number of bits to be at low level for performing writing is small, and a leak path is small. Thus, increase in the leak currents from the sources of the memory cell transistors to the bit line can be suppressed even when the source voltage is increased during a program operation.

On the other hand, in the memory block as the code storage memory area, since the number of memory cells per bit line (cell/BL) is large and the program page size is large, the increase in leak currents becomes large when the source voltage is increased during a program operation. However, in the memory block as the code storage memory area, since the program page size is large, the number of writes (number of pages) per word line is small, and the time for the memory cells to suffer the gate disturb is short. Thus, the need to increase the source voltage during a program operation is low.

Accordingly, in the embodiment which will be described below, the source voltage to be supplied during a program operation is made to be different between the memory block as the code storage memory area and the memory block as the work memory area, and a high source voltage is supplied to the memory block as the work memory area during a program operation. Thus, the change in the threshold voltage of memory cells due to gate disturb is suppressed, and increase in leak currents from the sources of the memory cells to the bit line is suppressed.

FIG. 1 is a block diagram illustrating a structural example of a semiconductor memory device in this embodiment. The semiconductor memory device in this embodiment is a non-volatile flash memory in which data are electrically rewritable. The flash memory in this embodiment has a memory core unit 11, a command generating circuit 12, an internal voltage generating circuit 13, a memory core control circuit 14, an address generating circuit 15, and a data input and output circuit 16.

The memory core unit 11 has a plurality of non-volatile memory cell transistors in which data are electrically rewritable. The command generating circuit 12 is activated by a chip enable signal CEB and outputs a mode signal MODE and a control signal CTS according to a control signal CP0-3 and a write enable signal WEB. The command generating circuit 12 outputs the mode signal MODE and the control signal CTS instructing the state of operating mode such as a read operation, a program operation, and an erase operation according to the control signal CP0-3 and the write enable signal WEB.

The internal voltage generating circuit 13 generates a voltage PWS for operation of the memory core unit 11 according to the mode signal MODE, and supplies this voltage to the memory core unit 11. The memory core control circuit 14 generates a memory core control signal MCTL controlling the memory core unit 11 according to the mode signal MODE, and outputs the generated signal to the memory core unit 11. The memory core control signal MCTL includes control signals other than those for power supply, address signals, and data signals.

The address generating circuit 15 generates a row address signal RA and a column address signal CA according to the mode signal MODE based on an inputted address signal FA00-FA20, and outputs the generated signals to the memory core unit 11. The data input and output circuit 16 exchanges data with units outside the flash memory. The data input and output circuit 16 inputs data inputted from the outside by an input data signal DIN00-DIN15 as input data DI to the memory core unit 11, and outputs output data DO from the memory core unit 11 to the outside by an output data signal DO00-DO15.

Figure 2:
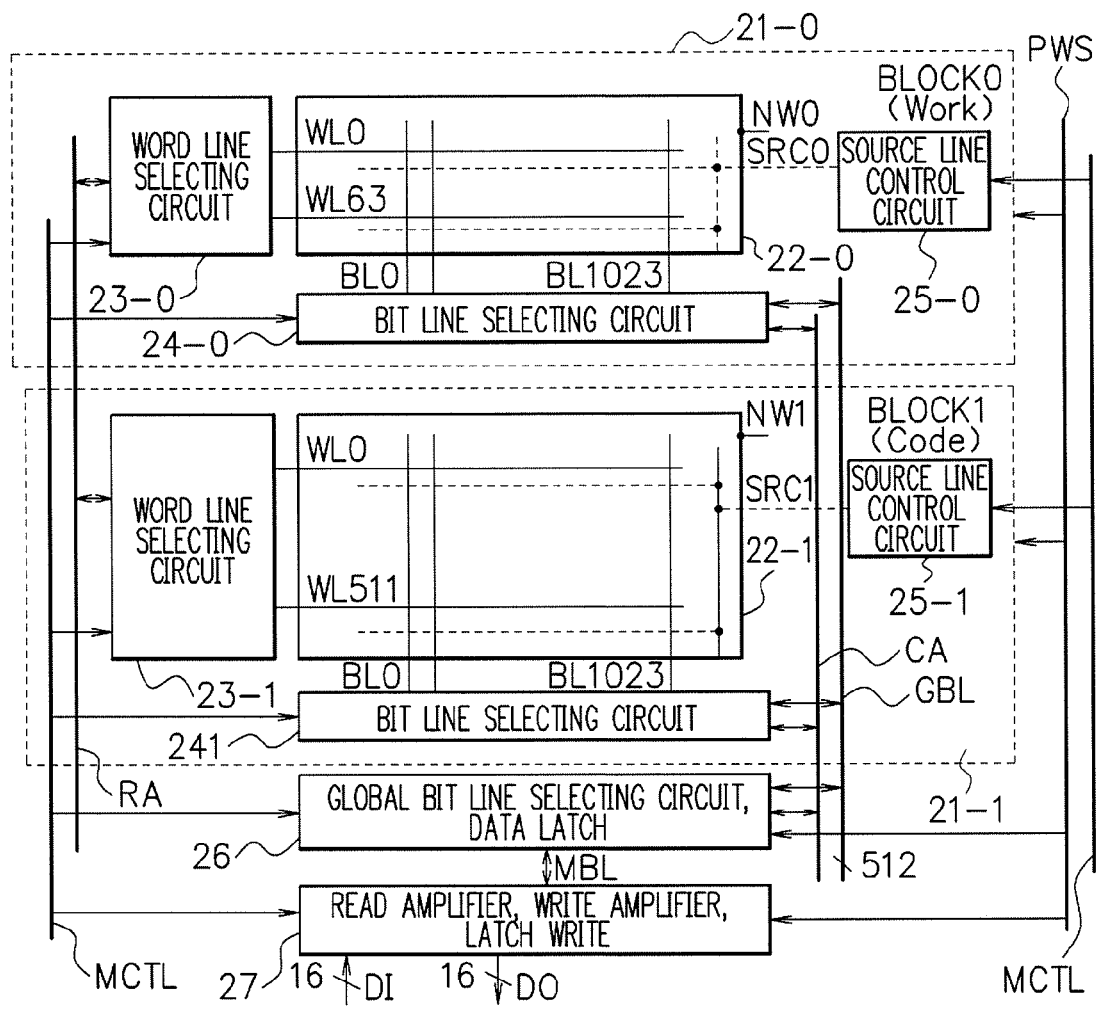
FIG. 2 is a diagram illustrating a structural example of a memory core unit in this embodiment.

FIG. 2 is a diagram illustrating a structural example of the memory core unit 11 in this embodiment. The memory core unit 11 has a plurality of memory blocks 21-0, 21-1, a circuit 26 including a global bit line selecting circuit and a data latch, and a circuit 27 including a read amplifier, a write amplifier, and a latch write unit. The memory block 21-0 is a memory block as the work memory area (work area) for storing work data. The memory block 21-1 is a memory block as the code storage memory area (code area) for storing control codes. Note that in FIG. 2, each of the work memory area and the code storage memory area is illustrated as one memory block, but the number of memory blocks provided as the work memory area and the number of memory blocks provided as the code storage memory area are arbitrary.

Figure 3:
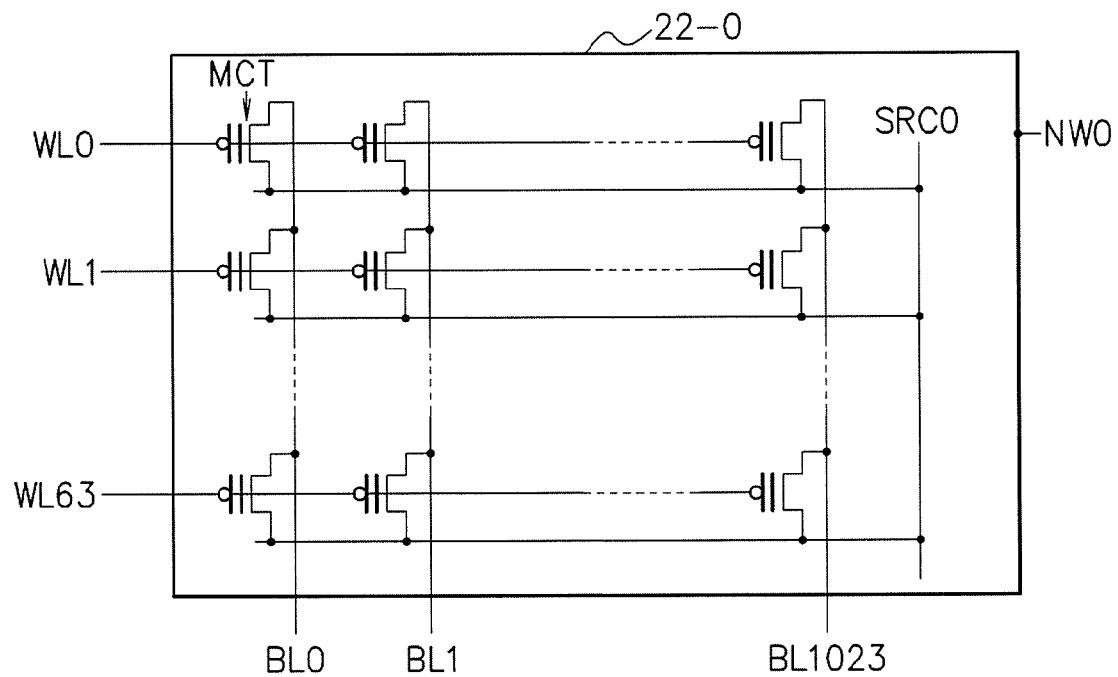
FIG. 3 is a diagram illustrating a structural example of a memory cell array in this embodiment.

The memory block 21-0 as the work memory area has a memory cell array 22-0, a word line selecting circuit 23-0, a bit line selecting circuit 24-0, and a source line control circuit 25-0. In the memory cell array 22-0, as illustrated in FIG. 3, a plurality of P-channel type memory cell transistors MCT are disposed in an array form. The memory cell transistors MCT in the memory cell array 22-0 are in the same N-type well to which a voltage is supplied via a power supply line NW0. Respective data retained in the memory cell transistors MCT are erased at once in the unit of the memory cell array 22-0 (memory block 21-0).

Each of the memory cell transistors MCT has a gate connected to a word line WL, a drain connected to a bit line BL, and a source connected to a source line SRC0. The gates of the memory cell transistors MCT disposed in the same row are connected in common to one word line WL, and the drains of the memory cell transistors MCT disposed in the same column are connected in common to one bit line BL. Further, the sources of all the memory cell transistors MCT are connected in common to one source line SRC0.

The word line selecting circuit 23-0 selects a word line WL0 to WL63 based on the row address signal RA outputted from the address generating circuit 15. The bit line selecting circuit 24-0 selects bit lines BL0 to BL1023 based on the column address signal CA outputted from the address generating circuit 15, and connects the selected bit lines BL0 to BL1023 and global bit lines GBL.

The source line control circuit 25-0 supplies to the source line SRC0 a voltage depending on the operating mode and memory block selection based on the memory control signal MCTL outputted from the memory core control circuit 14. The source line control circuit 25-0 supplies a high voltage V24 (for example, 2.4 V) to the source line SRC0 when the operating mode is a program operation and the memory block 21-0 is selected, or supplies a voltage V18 (for example, 1.8 V) to the source line SRC0 when a different memory block is selected. The source line control circuit 25-0 supplies 1.8 V to the source line SRC0 regardless of the memory block when the operating mode is a read operation, and supplies, when the operating mode is an erase operation, 9 V to the source line SRC0 when the memory block 21-0 is selected or supplies 1.8 V to the source line SRC0 when the memory block 21-0 is not selected.

The memory block 21-1 as the code storage memory area has a memory cell array 22-1, a word line selecting circuit 23-1, a bit line selecting circuit 24-1, and a source line control circuit 25-1. In the memory cell array 22-1, a plurality of P-channel type memory cell transistors are disposed in an array form similarly to the memory cell array 22-0. The memory cell transistors in the memory cell array 22-1 are in the same N-type well to which a voltage is supplied via a power supply line NW1, and their respective retained data are erased at once in the unit of the memory cell array 22-1 (memory block 21-1). Among the memory cell transistors in the memory cell array 22-1, the gates of the memory cell transistors disposed in the same row are connected in common to one word line WL, and the drains of the memory cell transistors disposed in the same column are connected in common to one bit line BL. Further, the sources of all the memory cell transistors are connected in common to one source line SRC1.

The word line selecting circuit 23-1 selects a word line WL0 to WL511 based on the row address signal RA outputted from the address generating circuit 15. The bit line selecting circuit 24-1 selects bit lines BL0 to BL1023 based on the column address signal CA outputted from the address generating circuit 15, and connects the selected bit lines BL0 to BL1023 and global bit lines GBL.

The source line control circuit 25-1 supplies to the source line SRC1 a voltage depending on the operating mode and memory block selection based on the memory control signal MCTL outputted from the memory core control circuit 14. The source line control circuit 25-1 supplies a voltage V18 (for example, 1.8 V) to the source line SRC1 when the operating mode is a program operation. The source line control circuit 25-1 supplies 1.8 V to the source line SRC1 regardless of the memory block when the operating mode is a read operation, and supplies, when the operating mode is an erase operation, 9 V to the source line SRC1 when the memory block 21-1 is selected or supplies 1.8 V to the source line SRC1 when the memory block 21-1 is not selected.

In the example illustrated in FIG. 2, the memory block 21-0 as the work memory area has 64 word lines WL, the memory block 21-1 as the code storage memory area has 512 word lines. That is, the number of word lines WL which the memory block 21-0 as the work memory area has is smaller than the number of word lines WL which the memory block 21-1 as the code storage memory area has. Thus, the number of memory cells per bit line (cells/BL) is 64 cells/BL in the memory block 21-0 as the work memory area, and is 512 cells/BL in the memory block 21-1 as the code storage memory area. Therefore, the memory capacity is 8K bytes in the memory block 21-0 as the work memory area and is 64K bytes in the memory block 21-1 as the code storage memory area.

The global bit line selecting circuit of the circuit 26 connects global bit lines GBL and main bit lines MBL based on the column address signal CA outputted from the address generating circuit 15. The data latch of the circuit 26 is a latch to which data to be written are set in advance. The read amplifier of the circuit 27 reads data of a memory cell according to the current flowing in a memory cell transistor connected via the main bit lines MBL, the global bit lines GBL, and the bit lines BL, and outputs the data as output data DO. The write amplifier of the circuit 26 outputs a voltage to the global bit lines GBL based on input data DI.

In the memory core unit 11 illustrated in FIG. 2, voltage setting in each operation is similar to that of the example illustrated in FIG. 20. However, in this embodiment, when the operating mode is a program operation and the memory block 21-0 as the work memory area is selected, a high source voltage (for example, 2.4 V) is supplied to the source line SRC0. When the operating mode is a program operation, and the memory block 21-0 as the work memory area is not selected, a normal source voltage (for example, 1.8 V) is supplied to the source line SRC0.

Figure 4:
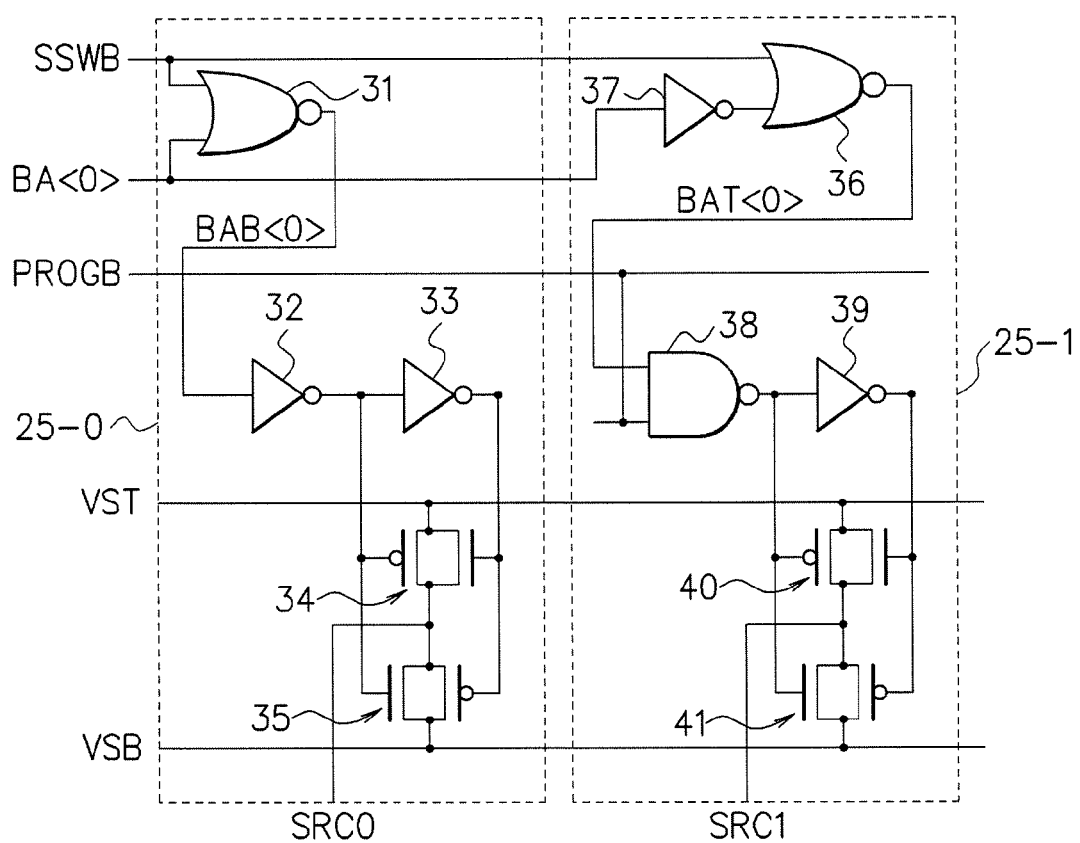
FIG. 4 is a diagram illustrating a structural example of source line control circuits in this embodiment.

FIG. 4 is a diagram illustrating a structural example of the source line control circuits in this embodiment. In FIG. 4, a block selection signal BA<0> and control signals PROGB, SSWB are signals included in the memory control signal MCTL. The block selection signal BA<0> is set to low level when the memory block 21-0 as the work memory area is selected, and set to high level when the memory block 21-1 as the code storage memory area is selected. The control signal PROGB is set to low level when the operating mode is a program operation, and the control signal SSWB is set to high level when both the source lines SRC0, SRC1 are connected to a power supply line VSB.

The source line control circuit 25-0 provided in the memory block 21-0 as the work memory area has a negative logical sum operation circuit (NOR circuit) 31, inverters 32, 33, and transfer gates 34, 35. The NOR circuit 31, to which the block selection signal BA<0> and the control signal SSWB are inputted, outputs an operation result thereof as a signal BAB<0>. To the inverter 32 the signal BAB<0> is inputted, and an output thereof is outputted to the inverter 33. By outputs of the inverters 32, 33, the transfer gates 34, 35 are controlled and a power supply line VST or VSB is connected to the source line SRC0.

The source line control circuit 25-1 provided in the memory block 21-1 as the code storage memory area has a NOR circuit 36, inverters 37, 39, a negative logical product operation circuit (NAND circuit) 38, and transfer gates 40, 41. The NOR circuit 36, to which the block selection signal BA<0> is inputted via the inverter 37 and the control signal SSWB is inputted, outputs an operation result thereof as a signal BAT<0>. The NAND circuit 38, to which the signal BAT<0> and the control signal PROGB are inputted, outputs an operation result thereof. To the inverter 39 the output of the NAND circuit 38 is inputted. By outputs of the NAND circuit 38 and the inverter 39, the transfer gates 40, 41 are controlled and the power supply line VST or VSB is connected to the source line SRC1.

When the operating mode is a program operation, the internal voltage generating circuit 13 sets the voltage of the power supply line VST higher than the voltage of the power supply line VSB. For example, the voltage of the power supply line VST is set to 2.4 V, and the voltage of the power supply line VSB is set to 1.8 V. When the operating mode is a program operation and the memory block 21-0 as the work memory area is selected, the block selection signal BA<0> and the control signals PROGB, SSWB are all set to low level. At this time, since the signal BAB<0> is at high level, the source line SRC0 is connected to the power supply line VST. On the other hand, since the signal BAT<0> is at low level, the output of the NAND circuit 38 becomes high level. Thus, the source line SRC1 is connected to the power supply line VSB.

Further, when the operating mode is a program operation and the memory block 21-1 as the code storage memory area is selected, the block selection signal BA<0> is set to high level, and the control signals PROGB, SSWB are set to low level. At this time, since the signal BAB<0> is at low level, the source line SRC0 is connected to the power supply line VSB. On the other hand, since the signal BAT<0> is at high level but the control signal PROGB is at low level, the output of the NAND circuit 38 becomes high level. Thus, the source line SRC1 is connected to the power supply line VSB.

When the operating mode is a read operation, the control signals PROGB, SSWB are set to high level, and the source lines SRC0, SRC1 are connected to the power supply line VSB. When the operating mode is an erase operation, the control signal PROGB is set to high level, and the control signal SSWB is set to low level, thereby connecting the source line of the selected memory block to the power supply line VST and connecting the source line of the non-selected memory block to the power supply line VSB. Note that when the operating mode is an erase operation, the voltage of the power supply line VST is set to 9 V for example, and the voltage of the power supply line VSB is set to 1.8 V for example.

Figures 5, 6:
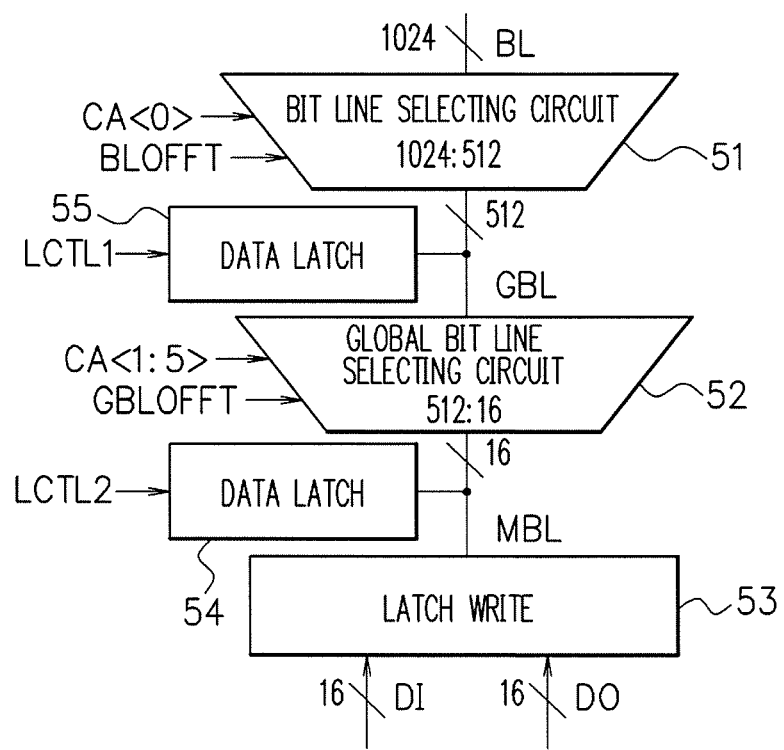
FIG. 5 is a diagram illustrating an example of source line voltage control in this embodiment.
FIG. 6 is a diagram for describing bit line selection in this embodiment.

Thus, the source line control circuits 25-0, 25-1 control the connecting states of the source lines SRC0, SRC1 and the power supplies VST, VSB, and controls the source line voltage as illustrated in FIG. 5. Note that in the source line control circuits 25-0, 25-1 illustrated in FIG. 4, the input signals and high level output voltages of logic elements as well as back bias of the P-channel transistors are set higher than the voltages of the power supply lines VST, VSB.

FIG. 6 is a diagram for describing bit line selection in this embodiment. In this embodiment, writing of 16 bits is performed at once as writing in the memory block 21-0 as the work memory area, and writing of 512 bits is performed at once as writing in the memory block 21-1 as the code storage memory area.

As illustrated in FIG. 6, one data latch 55 for the code storage memory area controlled by a latch control signal LCTL1 is connected to each global bit line GBL. Further, one data latch 54 for the work memory area controlled by a latch control signal LCTL2 is connected to each main bit line MBL.

In writing to the memory block 21-0 as the work memory area, a bit line selecting circuit 51 and a global bit line selecting circuit 52 select 16 bit lines from among the 1024 bit lines BL and connect them to the main bit lines MBL according to the column address signal CA. Then, writing is performed from the data latch 54 to which data are written in advance.

In writing to the memory block 21-1 as the code storage memory area, the bit line selecting circuit 51 selects 512 bit lines from among the 1024 bit lines BL according to the column address signal CA and connects them to the global bit lines GBL. A control signal GBLOFFT at this time is set to high level, and the global bit line selecting circuit 52 sets the global bit lines GBL and the main bit lines MBL to a non-connected state. Then, writing is performed from the data latch 55 to which data are written in advance.

Note that a latch writing unit 53 drives, during a latch WRITE mode, the main bit line MBL to write to the data latches 54, 55 based on the input data DI and the output data DO, or reads, during a latch READ mode, the states of the data latches 54, 55. During the latch WRITE mode and the latch READ mode, a control signal BLOFFT is set to high level, and the bit line selecting circuit 51 sets the bit line BL and the global bit line GBL to a non-connected state. In the case of writing to the memory block 21-0 as the work memory area, the control signal GBLOFFT is set to high level, and the global bit line selecting circuit 52 sets the global bit line GBL and the main bit line MBL to a non-connected state. On the other hand, in the case of writing to the memory block 21-1 as the code storage memory area, the global bit line selecting circuit 52 selects the global bit lines GBL and the main bit lines MBL according to the column address signal CA.

FIG. 7 is a diagram illustrating a structural example of the bit line selecting circuit 51 in this embodiment. As illustrated in FIG. 7, control signals BLOFFT, FLT are signals included in the memory control signal MCTL. The control signal BLOFFT is set to high level when the bit line BL and the global bit line GBL are set to a non-connected state, and the control signal FLT is set to high level when a non-selected bit line is set to a floating state.

The bit line selecting circuit 51 connects bit lines BL to global bit lines GBL according to a column address signal CA<0>. The bit line selecting circuit 51 connects one of two bit lines BL(2$i$), BL(2$i$+1) (i is an index and is an integer of 0 to 255) to one global bit line GBLi according to the column address signal CA<0>. FIG. 7 illustrates a structure in which one of two bit lines BL0, BL1 is connected to one global bit line GBL0, and one of two bit lines BL2, BL3 is connected to one global bit line GBL1, but the other bit lines and global bit lines are structured similarly.

When the control signals BLOFFT, FLT are both at low level and the column address signal CA<0> is at low level, the outputs of NOR circuits 61, 64 become high level, and the outputs of NOR circuits 62, 63 become low level. That is, signals SYT0, SYB1 become high level, and signals SYT1, SYB0 become low level. Therefore, the bit line BL0 is selected and connected to the global bit line GBL0, the bit line BL2 is selected and connected to the global bit line GBL1, and the non-selected bit lines BL1, BL3 are connected to the power supply line V24. That is, a bit line BL(2$i$) is selected and connected to a global bit line GBLi, and non-selected bit lines BL(2$i$+1) are connected to the power supply line V24.

When the control signals BLOFFT, FLT are both at low level and the column address signal CA<0> is at high level, the outputs of the NOR circuits 62, 63 become high level, and the outputs of the NOR circuits 61, 64 become low level. That is, the signals SYT1, SYB0 become high level, and the signals SYT0, SYB1 become low level. Therefore, the bit line BL1 is selected and connected to the global bit line GBL0, the bit line BL3 is selected and connected to the global bit line GBL1, and the non-selected bit lines BL0, BL2 are connected to the power supply line V24. That is, a bit line BL(2$i$+1) is selected and connected to a global bit line GBLi, and non-selected bit lines BL(2$i$) are connected to the power supply line V24.

When the control signal BLOFFT is at high level, the outputs of the NOR circuits 61, 63 become low level. That is, the signals SYT0, SYT1 both become low level, and the bit lines BL and the global bit lines GBL are not connected. Moreover, when the control signal FLT is at low level, the outputs of the NOR circuits 62, 64 become high level. That is, the signals SYB0, SYB1 both become high level, and the non-selected bit lines BL are connected to the power supply line V24. Thus, the voltages of the non-selected bit lines BL in a program operation are set. Further, when the control signal FLT is at high level, the non-selected bit lines are not connected to the power supply line V24 and become a high impedance (HiZ) state. The non-selected bit lines are set in this state in a read operation and an erase operation.

FIG. 8 is a diagram illustrating a structural example of a global bit line selecting circuit 52 in this embodiment. In FIG. 8, the control signals GBLOFFT, FLT are signals included in the memory control signal MCTL. The control signal GBLOFFT is set to high level when the global bit line GEL and the main bit line MBL are set to a non-connected state, and the control signal FLT is set to high level when non-selected global bit lines are set to a floating state.

The global bit line selecting circuit 52 connects global bit lines GBL to main bit lines MBL according to a column address signal CA<1:5>. The global bit line selecting circuit 52 connects one of 32 global bit lines GBL(32$j$) to GBL(32$j$+31) (j is an index and is an integer of 0 to 15) to one main bit line MBL<j> according to the column address signal CA<1:5>. FIG. 8 illustrates a structure in which one of 32 global bit lines GBL0 to GBL32 is connected to one main bit line MBL<0>, but the other global bit lines and main bit line are structured similarly.

To a signal generating circuit 72, a column address signal CA<1:5> and an inverted column address signal CAB<1:5> are inputted selectively. The column address signal CAB<1:5> is a signal obtained by inverting the column address signal CA<1:5> by an inverter 71. When the control signals GBLOFFT, FLT are both at low level, among 32 signal generating circuits 72 which exist with respect to the main bit line MBL<0>, the output of a NAND circuit 73 of one signal generating circuit 72 corresponding to the column address signal CA<1:5> becomes low level, and the outputs of NAND circuits 73 of the other signal generating circuits 72 become high level.

Thus, in one signal generating circuit 72 corresponding to the column address signal CA<1:5>, the output of a NOR circuit 74 becomes high level, and the output of a NOR circuit 75 becomes low level. In the other signal generating circuits 72, the output of the NOR circuit 74 becomes low level, and the output of the NOR circuit 75 becomes high level. That is, among 32 signals SGT<0:31>, one signal SGT corresponding to the column address signal CA<1:5> becomes high level, and the other signals SGT become low level. Among 32 signals SGB<0:31>, one signal SGB corresponding to the column address signal CA<1:5> becomes low level, and the other signals SGB become high level. Thus, the global bit line GBL corresponding to the column address signal CA<1:5> is selected and connected to the main bit line MBL, and the non-selected global bit lines GBL are connected to the power supply line V24.

When the control signal GBLOFFT is at high level, the output of the NOR circuit 74 becomes low level. That is, all the signals SGT<0:31> become low level, and the global bit lines GBL and the main bit lines MBL are not connected. When the control signal FLT is at high level, the non-selected global bit lines which do not correspond to the column address signal CA<1:5> are not connected to the power supply line V24 and becomes a high impedance (HiZ) state.

Figure 9:
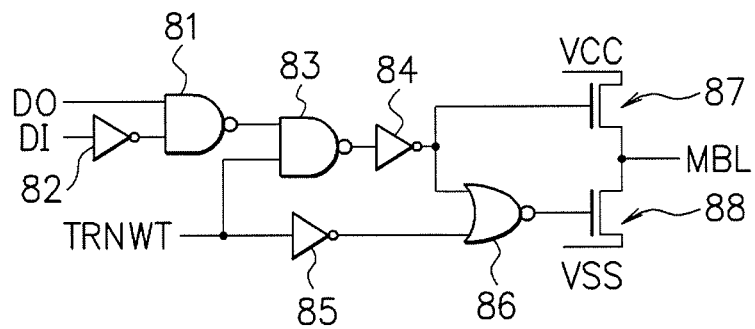
FIG. 9 is a diagram illustrating a structural example of a latch writing unit in this embodiment.

FIG. 9 is a diagram illustrating a structural example of the latch writing unit 53 in this embodiment. In FIG. 9, a control signal TRNWT is a signal included in the memory control signal MCTL. The control signal TRNWT is set to high level in a latch WRITE mode in which the main bit line MBL is driven based on the data DI and DO to perform writing to a data latch.

The latch writing unit 53 has NAND circuits 81, 83, inverters 82, 84, 85, a NOR circuit 86, and N-channel transistors 87, 88. The NAND circuit 81, to which the data DO are inputted and the data DI are inputted via the inverter 82, outputs an operation result thereof. The NAND circuit 83, to which the output of the NAND circuit 81 and the control signal TRNWT are inputted, outputs an operation result thereof. The output of the NAND circuit 83 is supplied to the gate of an N-channel transistor 87 via the inverter 84. The NOR circuit 86, to which the output of the NAND circuit 83 is inputted via the inverter 84 and the control signal TRNWT is inputted via the inverter 85, outputs an operation result thereof. The output of the NOR circuit 86 is supplied to the gate of the N-channel transistor 88. The main bit line MBL is connected to a power supply line of voltage VCC via the N-channel transistor 87, and is connected to a power supply line of voltage VSS via the N-channel transistor 88.

In the latch WRITE mode, the control signal TRNWT is set to high level. When the data DI are at high level, the N-channel transistor 87 becomes a conducting state, the N-channel transistor 88 becomes a non-conducting state, and the main bit line MBL becomes high level. When the data DI are at low level, if the data DO are at high level, the N-channel transistor 87 becomes a non-conducting state, the N-channel transistor 88 becomes a conducting state, and the main bit line MBL becomes low level, or if the data DO are at low level, the main bit line MBL becomes high level. The output of the data DO after verified becomes low level when the threshold voltage of the memory cell succeeds a verify level, or otherwise becomes high level.

Figure 10:
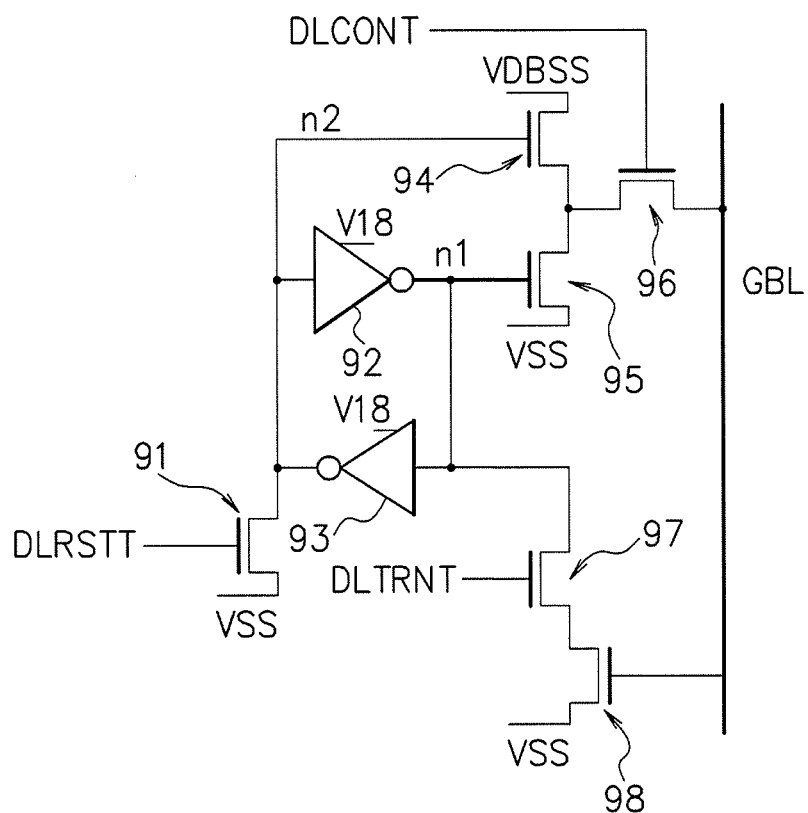
FIG. 10 is a diagram illustrating a structural example of a data latch in this embodiment.

FIG. 10 is a diagram illustrating a structural example of a data latch in this embodiment. The data latch has a latch having inverters 92, 93 and N-channel transistors 91, 94, 95, 96, 97, 98 for control. In FIG. 10, control signals DLRSTT, DLCNOT, DLTRNT are signals included in the memory control signal MCTL, and VDBSS is the voltage PWS supplied from the internal voltage generating circuit 13. An input signal and the control signals DLRSTT, DLCNOT, DLTRNT have an amplitude of voltage VCC to voltage VSS, and the voltage VDBSS is an amplitude of voltage V18 to voltage VSS.

The control signals DLRSTT, DLCNOT, DLTRNT and the voltage VDBSS are controlled as illustrated in FIG. 11. When it is on standby or when the work memory area is selected, the control signals DLRSTT, DLCNOT, DLTRNT are set to low level. When it is reset, the control signal DLRSTT becomes high level, the N-channel transistor 91 is set to a conducting state, and a node n2 becomes low level. This state represents a fail state.

When a latch WRITE is performed which is to write data in the latch, the control signal DLTRNT becomes high level, and the N-channel transistor 97 is set to a conducting state. When the global bit line GBL is at high level at this moment, the N-channel transistor 98 is set to a conducting state, and a node n1 becomes low level. This state represents a pass state. After verification, when the data DO become low level or the data DI are set to high level, the latch becomes the pass state.

When a latch READ is performed which is to read the state of the latch, the bit line selecting circuits 51 selects none, and the global bit line selecting circuit 52 performs selection. The global bit line GBL becomes high level in the pass state, and the global bit line GBL becomes low level in the fail state. When a program is performed to write data of the data latch to memory cells, a control signal DLCONT is set to high level, and the global bit line GBL is driven according to the data retained in the latch of the inverters 92, 93.

Figure 12:
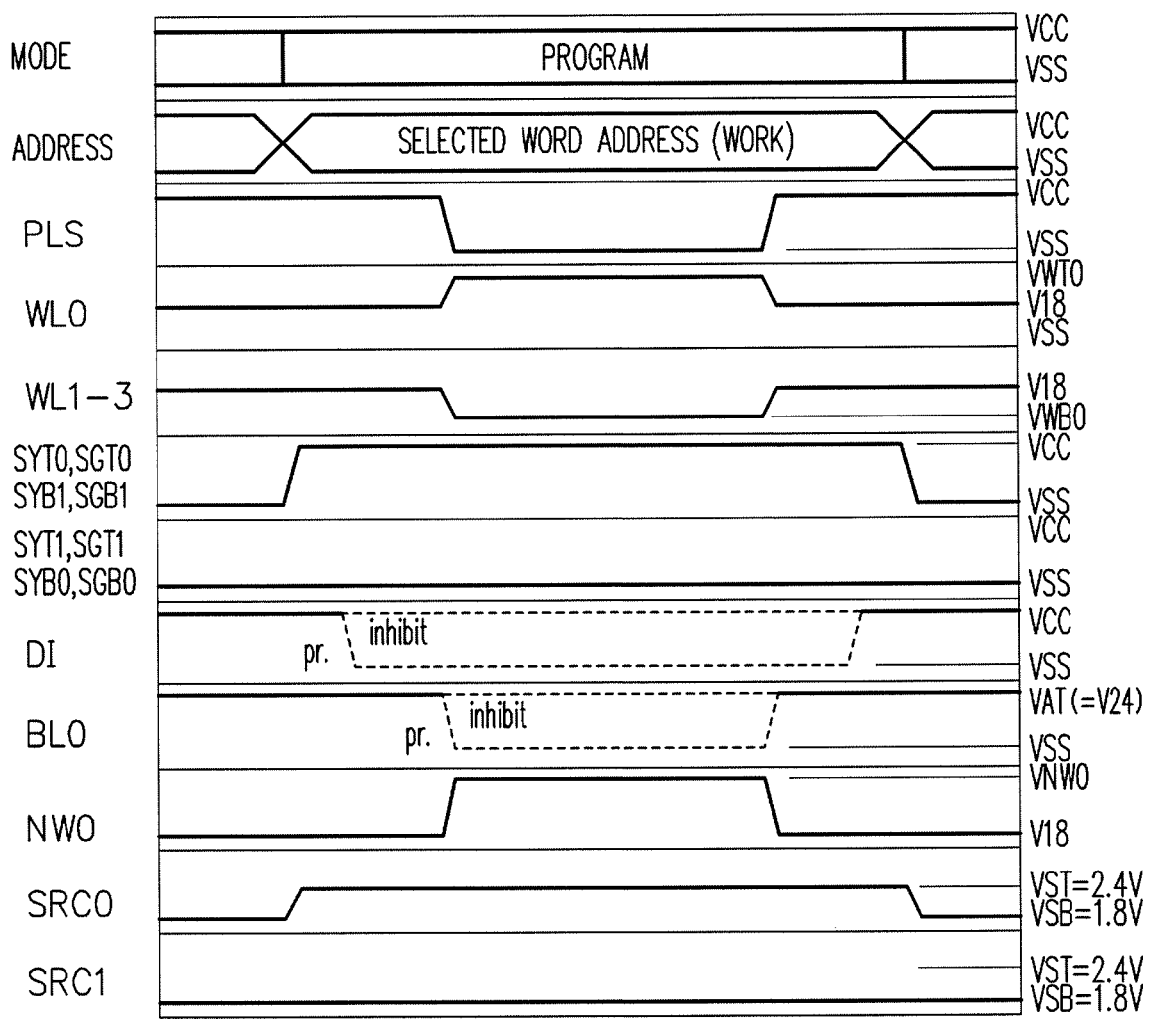
FIG. 12 is a waveform chart illustrating an example of a program operation of a work memory area in the semiconductor memory device in this embodiment.

FIG. 12 is a waveform chart illustrating an example of the program operation in the semiconductor memory device in this embodiment. FIG. 12 illustrates an example of a program operation to the memory block 21-0 as the work memory area. FIG. 12 illustrates an example in which, for simplicity of description, the number of word lines WL is 4, and writing is performed on the memory cells connected to the word line WL0 and the bit line BL0.

Upon entering an operating mode to perform the program operation, simultaneously the address generating circuit 15 sets a selected word address for specifying a row and a column. When an address of the memory block 21-0 as the work memory area is specified as the selected word address, the source line control circuit 25-0 supplies a high source voltage VST (for example, 2.4 V) to the source line SRC0. At this time, the source line control circuit 25-1 of the memory block 21-1 as the code storage memory area supplies a source voltage VSB (for example, 1.8 V) to the source line SRC1.

When the selected word address is set, the bit line selecting circuit 51 and the global bit line selecting circuit 52 set the selection signals SYT0, SGT0 to high level according to a column address CA. Thus, the selected memory cells are connected to the write amplifier. The bit line selecting circuit 51 and the global bit line selecting circuit 52 also set the non-selected bit lines BL to an inhibit voltage (V24) by setting the selection signals SYB1, SGB1 to SGB32 to high level according to the column address CA.

Then, when a control signal PLS becomes low level, the write amplifier sets the voltage of the main bit line MBL according to the input data DI. In the case of a bit to be written, low level is inputted as the input data DI, and the selected bit line BL0 becomes VSS (for example, 0 V). In the case of a bit not to be written, high level is inputted as the input data DI, and the selected bit line BL0 becomes V24 (for example, 2.4 V).

When the control signal PLS becomes low level, the word line selecting circuit 23-0 selects the word line WL0 according to a row address RA, and sets the selected word line WL0 to a high voltage (VWT0) of about 9 V in the program operation. The word line selecting circuit 23-0 also sets the non-selected word lines WL (WL1-3) to 0 V (VWB0). At this time, the voltage of the N-type well is set to an Nwell voltage (VNW0) of about 5 V for a program operation. Thus, writing to the memory block 21-0 as the work memory area is performed.

Figure 13:
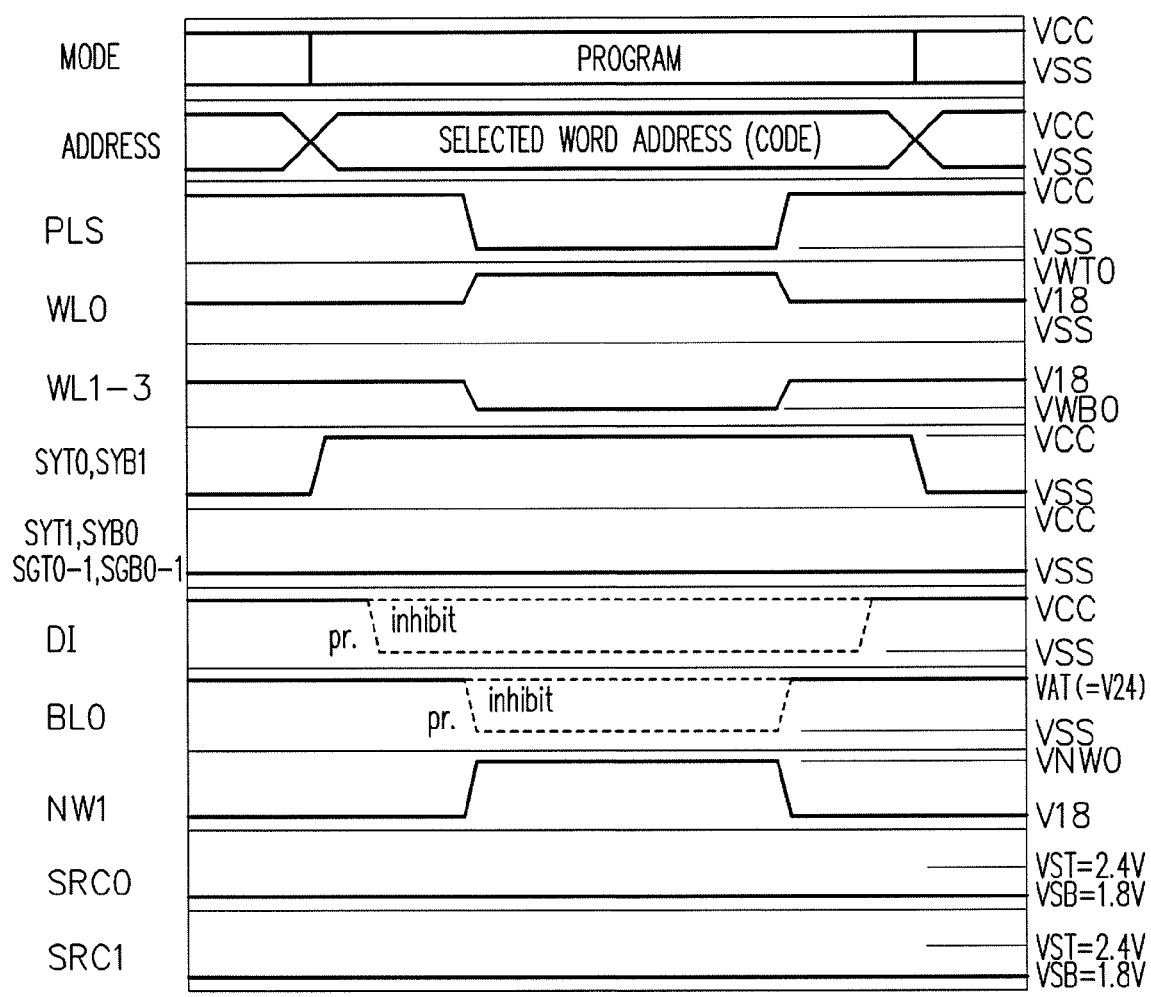
FIG. 13 is a waveform chart illustrating an example of a program operation of a code storage memory area in the semiconductor memory device in this embodiment.

FIG. 13 is a waveform chart illustrating another example of the program operation in the semiconductor memory device in this embodiment. FIG. 13 illustrates an example of a program operation to the memory block 21-1 as the code storage memory area. FIG. 13 illustrates an example in which, for simplicity of description, the number of word lines WL is four, and writing is performed on the memory cells connected to the word line WL0 and the bit line BL0.

Upon entering an operating mode to perform the program operation, simultaneously the address generating circuit 15 sets a selected word address for specifying a row and a column. When an address of the memory block 21-1 as the code storage memory area is specified as the selected word address, the source line control circuits 25-0, 25-1 supply the source voltage VSB (for example, 1.8 V) to the source lines SRC0, SRC1.

When the selected word address is set, the bit line selecting circuit 51 sets the selection signal SYT0 to high level according to a column address CA. Thus, the selected memory cells are connected to the data latch 55. The bit line selecting circuit 51 also sets the non-selected bit lines BL to an inhibit voltage (V24) by setting the selection signal SYB1 to high level according to the column address CA.

Then, when the control signal PLS becomes low level, the voltage of the global bit line GBL is set according to the data outputted from the data latch 55. In the case of a bit to be written, low level is inputted as data, and the selected bit line BL0 becomes VSS (for example, 0 V). In the case of a bit not to be written, high level is inputted as data, and the selected bit line BL0 becomes V24 (for example, 2.4 V).

When the control signal PLS becomes low level, the word line selecting circuit 23-1 selects the word line WL0 according to a row address RA, and sets the selected word line WL0 to a high voltage (VWT0) of about 9 V in the program operation. The word line selecting circuit 23-0 also sets the non-selected word lines WL (WL1-3) to 0 V (VWB0). At this time, the voltage of the N-type well is set to an Nwell voltage (VNW0) of about 5 V for a program operation. Thus, writing to the memory block 21-1 as the code storage memory area is performed.

FIG. 14 is a waveform chart illustrating an example of the read operation in the semiconductor memory device in this embodiment. FIG. 14 illustrates an example in which, for simplicity of description, the number of word lines WL of the memory block to which the read operation is performed is four, and data are read from memory cells connected to the word line WL0 and the bit line BL0.

Upon entering an operating mode to perform the read operation, simultaneously the address generating circuit 15 sets a selected word address for specifying a row and a column. When the selected word address is set, the bit line selecting circuit 51 and the global bit line selecting circuit 52 sets the selection signals SYT0, SGT0 to high level according to a column address CA. Further, the bit line selecting circuit 51 and the global bit line selecting circuit 52 retain the other selection signals SYT1, SGT1, SYB0-1, SGB0-1 at low level according to the column address CA. The main bit line MBL is set to V18 (for example, 1.8 V) which is the same voltage as that of the source line when the control signal PLS is at high level.

Then, when the control signal PLS changes to low level, the word line selecting circuit 23 selects the word line WL0 according to a row address RA, and sets the selected word line WL0 to a read level (VWT0) of negative potential. Further, the word line selecting circuit 23 sets the non-selected word lines WL (WL1-3) to the same voltage (V18) as that of the source line. When the voltage of the selected word line WL0 becomes read level, the voltage of the main bit line MBL changes depending on the state of the memory cells. When the memory cells are in a program state (pr.) in which the threshold voltage is high, an electric current flows to the memory cells, and thus the main bit line MBL becomes high level. On the other hand, when the memory cells are in an erase state (er.) in which the threshold voltage is low, no electric current flows to the memory cells, and thus the main bit line MBL decreases in potential by the current source of the read amplifier and becomes low level. In response to the state of the main bit line MBL, the data output signal (DO) changes.

FIG. 15 is a waveform chart illustrating an example of the erase operation in the semiconductor memory device in this embodiment. FIG. 15 illustrates an example in which, for simplicity of description, the number of word lines WL of the memory block to which the erase operation is performed is four.

Upon entering an operating mode to perform the erase operation, simultaneously the address generating circuit 15 sets a memory block address. In the erase operation, the bit line selecting circuit 51 and the global bit line selecting circuit 52 retain all the selection signals (SYT0-1, SGT0-1, SYB0-1, SGB0-1) to low level. The control signal FLT becomes high level, and all the bit lines of the selected memory block are disconnected from the global bit line GBL and the power supply line V24.

When the memory block address is set, all the word lines WL (WL0-3) of the selected memory block are set to the voltage VSS, and thereafter are set to, when the control signal PLS changes to low level, a negative voltage (VWB0) of about −9 V for the erase operation. Further, when the control signal PLS changes to low level, a high voltage (VNW0) of about 9 V for the erase operation is set to the N-type well and the source line of the selected memory block. Thus, the erase operation to the memory block is performed.

Figure 17:
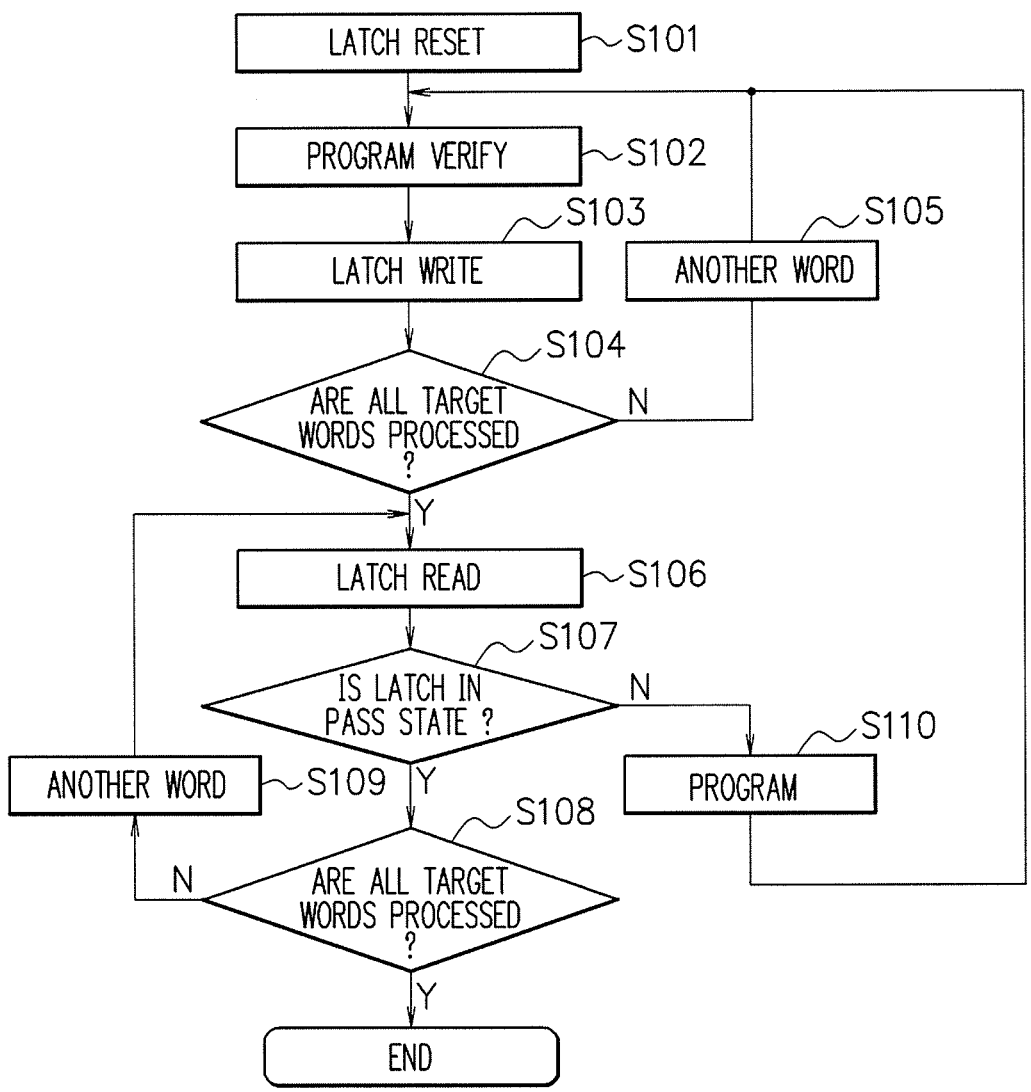
FIG. 17 is a flowchart illustrating an example of a program operation in the semiconductor memory device in this embodiment.

FIG. 16 is a waveform chart illustrating a specific example of the program operation in the semiconductor memory device in this embodiment. FIG. 16 illustrates an operating waveform when verify, latch WRITE, latch READ, and write (program) are performed. An operation flow thereof is illustrated in FIG. 17. Here, it is assumed that writing with one word is performed on the memory block 21-0 as the work memory area, and writing with 32 words is performed at once on the memory block 21-1 as the code storage memory area. Note that in the waveform chart illustrated in FIG. 16, the amplitude of each signal, or the like is voltage VCC to voltage VSS other than VDBSS.

First, a latch reset operation for resetting all the latches is performed before the writing is performed (S101). In the latch reset operation, the control signal DLRSTT is set to high level so as to reset the latches.

Next, a program verify operation is performed (S102). When the program verify operation is started, a row address and a column address are inputted. Then, when the control signal PLS changes to low level, similarly to the read operation, a word line WL is selected according to the row address, and data are read from the selected memory cells. Here, the voltage of the selected word line WL is set to the program verify level. When the program verify level is made to differ between the work memory area and the code storage memory area as will be described later, this voltage is changed depending on the target memory block. Then, a control signal DSETX is set to low level, and the result of verification is latched. The result is outputted as the output data DO0-15.

Next, with the addresses being the same, the operating mode enters the latch WRITE (LATW) mode to perform the latch WRITE operation (S103). At this time, the input data are set to DI. The control signal BLOFFT is set to high level, and the bit line BL and the global bit line GBL are set to a non-connected state. Then, when the control signal PLS changes to low level, the control signal TRNWT becomes high level, the target latch control signal DLTRNT becomes high level, and data reflecting the data DI and DO are written to the latch. A latch control signal which is not a target is set to low level.

Here, when the code storage memory area is the target, the column address CA0 is fixed, and the column addresses of words to be written at once are changed sequentially, so as to repeat the program verify operation and the latch WRITE operation. By performing this to all the words to be written at once, data of words to be written at once are written to the latch (S104, S105).

After the data are written to the latch as described above, the operating mode enters a latch READ (LATR) mode to perform a latch READ operation (S106). In the latch READ operation, the data of the latch are read. At this time, the voltage VDBSS is set to V18. The control signal BLOFFT is set to high level, and the bit line BL and the global bit line GBL are set to a non-connected state. Then, when the control signal PLS changes to low level, the target latch control signal DLCONT becomes high level, and the data of the latch are outputted to the main bit line MBL. A latch control signal which is not the target is set to low level. By the read amplifier outputting the data of the latch depending on the state of the main bit line MBL, whether the words as the target of writing are in the pass state or not is checked (S107). When the words as the target of writing are in the pass state, the writing is finished.

Note that when the code storage memory area is the target, the latch READ operation and the pass judgment of words are performed for all the words to be written at once, so as to confirm whether all the words are in the pass state or not. Then, when all the words to be written at once are in the pass state, the writing is finished (S108, S109).

When the words as the target of writing are not in the pass state, the operating mode enters the program mode and performs the program operation in order to perform writing from the latch (S110). In the program operation, the column address CA is set to be the same as the column address CA0 for which verification is performed. At this time, the voltage VDBSS is set to V18. The control signal BLOFFT is set to low level, a bit line BL is selected, and the selected bit line BL and the global bit line GBL are connected. Here, when the work memory area is the target, the control signal GBLOFFT is set to low level, a global bit line GBL is selected, and the selected global bit line GBL and the main bit line MBL are connected. On the other hand, when the code storage memory area is the target, the control signal GBLOFFT is set to high level, and the global bit line GBL and the main bit line MBL are set to a non-connected state. Then, when the control signal PLS changes to low level, the target latch control signal DLCONT becomes high level, and the data of the latches are outputted to the bit line BL. A latch control signal which is not the target is set to low level. When the latch is in a fail state, the selected bit line BL becomes low level, and writing is performed. Thereafter, it returns to the program verify operation again, and the above-described operation is repeated until the target words become the pass state, thereby writing the desired data.

Note that in this embodiment, by supplying the high source voltage to the memory block as the work memory area in the program operation, leak currents occur from the sources of the memory cells to the bit line. To suppress increase in the leak currents, the program verify level of the memory cells may be lowered further in the memory block as the work memory area, to thereby reduce the leak amount in the memory cells in the program state. When the program verify level of the memory cells is lowered, it is conceivable that the currents which flow to the memory cells in the read operation decrease, thereby lowering the read speed. However, in the work memory area, the read speed may be low, and thus it is possible to lower the program verify level.

Further, in order to suppress increase in the leak currents from the sources of the memory cells to the bit line which occurs by supplying the high source voltage, the voltages of the non-selected word lines WL in the program operation may be increased. When the voltages of the non-selected word lines WL in the program operation are increased, resistance to the drain disturb deteriorates, for example the threshold voltage changes from a solid line VL21 to a dashed line VL22 illustrated in FIG. 23, and the time taken until the threshold voltage begins to increase shortens. However, in the work memory area, the number of memory cells per bit line (cells/BL) is small and the time to be subjected to the drain disturb is short, and thus it is possible to increase the voltage of the non-selected word lines WL in the program operation.

Figure 18:
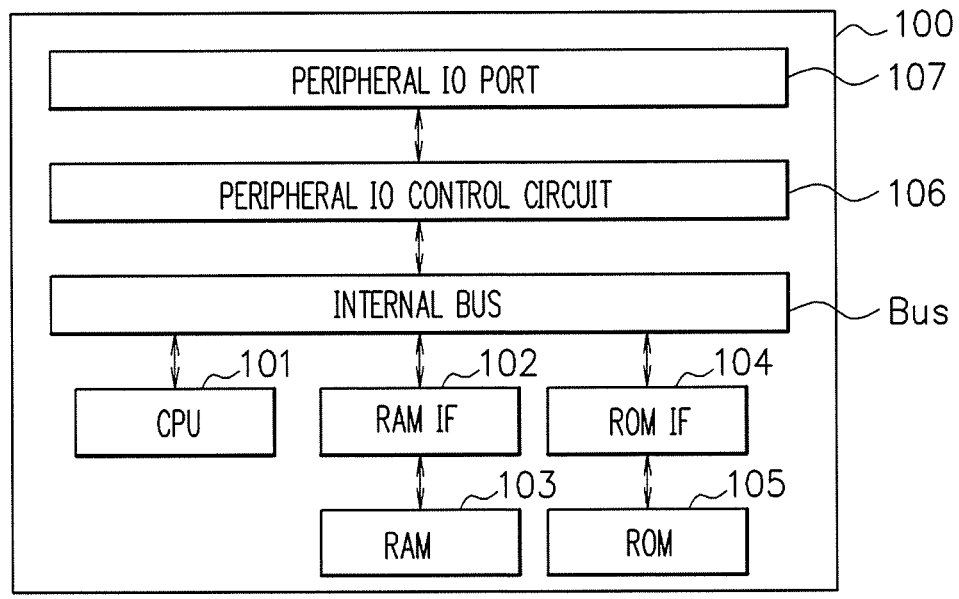
FIG. 18 is a diagram illustrating an example of a microcontroller which incorporates the semiconductor memory device in this embodiment.
Figure 19:
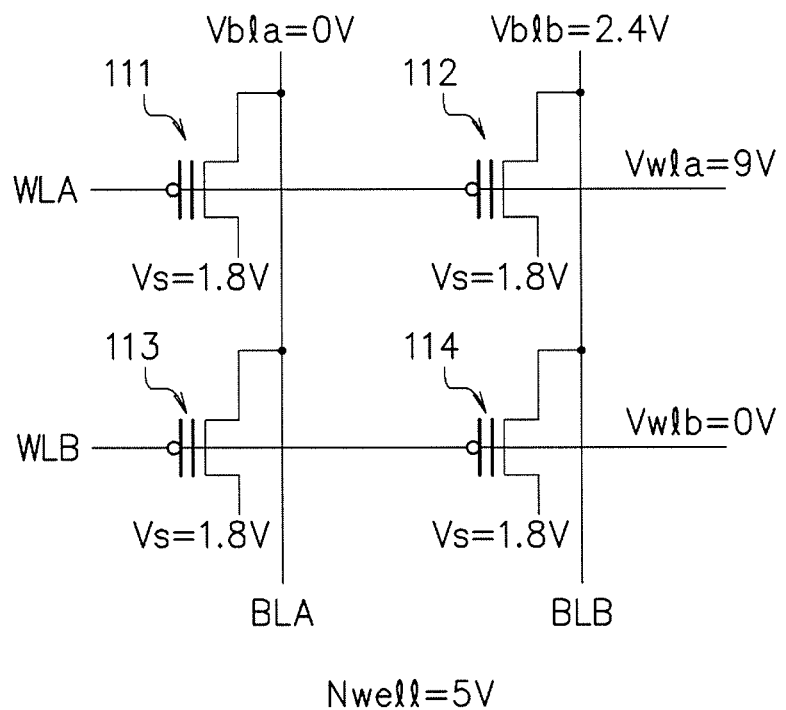
FIG. 19 is a diagram illustrating a memory cell array using P-channel type memory cells.

FIG. 18 is a diagram illustrating an example of a microcontroller which incorporates the semiconductor memory device in this embodiment. A microcontroller 100 has a CPU (Central Processing Unit) 101, a RAM (Read Only Memory) 103, a ROM (Random Access Memory) 105, a peripheral IO (Input Output) control circuit 106, and a peripheral IO port 107. The CPU 101 and the peripheral IO control circuit 106 are connected to an internal bus BUS, and the RAM 103 and the ROM 105 are connected to the internal bus BUS via a RAM interface 102 and a ROM interface 104. The CPU 101 reads and executes a program (code) stored in the ROM 105 or the like, so as to control various functional units in the microcontroller 100 to perform a desired processing operation. The semiconductor memory device in this embodiment is used as, for example, the ROM 105 illustrated in FIG. 18. Note that the semiconductor memory device according to this embodiment is not limited to the example illustrated in FIG. 18, and may be structured to be used as a single chip.

In the disclosed semiconductor memory device, in writing of a second block, a source line of the second block is supplied with a second voltage which is different from a first voltage supplied to a source line of a first block in writing of the first block. Thus, a change in the threshold voltage of memory cells due to gate disturb can be suppressed, and increase in leak currents can be suppressed.

All examples and conditional language provided herein are intended for pedagogical purposes to aiding the reader in understanding the invention and the concepts contributed by the inventor to furthering the art, and are not to be construed as limitation to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor memory device, comprising:
a plurality of memory cells, wherein each memory cell of the plurality of memory cells has a drain connected to a bit line, a gate connected to a word line, and a source connected to a source line, such that the memory cells of the plurality of memory cells connected in common to the bit line are connected in parallel between the bit line and the source line;
a first block which includes a plurality of first bit lines to each of which M number of memory cells (M is an integer of two or greater) among the memory cells are connected;

a second block which includes a plurality of second bit lines to each of which N number of memory cells (N is an integer of two or greater satisfying M>N) among the memory cells are connected;

a write circuit which selects P number of memory cells (P is an integer of two or greater) among the memory cells and performs writing at once in writing of the first block and selects Q number of memory cells (Q is an integer of two or greater satisfying P>Q) among the memory cells and performs writing at once in writing of the second block; and a source line control circuit which supplies a first voltage to the source line of the first block in writing of the first block and supplies a second voltage different from the first voltage to the source line of the second block in writing of the second block.

2. The semiconductor memory device according to claim 1, wherein the second voltage is higher than the first voltage.

3. The semiconductor memory device according to claim 2, wherein the plurality of memory cells of the first block are connected in common to a first source line and the plurality of memory cells of the second block are connected in common to a second source line.

4. The semiconductor memory device according to claim 2, wherein the memory cells are electrically rewritable non-volatile memory cells.

5. The semiconductor memory device according to claim 3, wherein the plurality of memory cells of the first block are disposed in a first well, the plurality of memory cells of the second block are disposed in a second well, and erasure is performed at once in each of the blocks.

6. The semiconductor memory device according to claim 4, wherein the memory cells are memory cells using P-channel type transistors.

7. The semiconductor memory device according to claim 1, wherein the first block is a code storage memory area storing control codes and the second block is a work memory area storing work data.

8. The semiconductor memory device according to claim 2, wherein the word line which is not selected when writing to the first block is performed is set to a third voltage in writing of the first block, and the word line which is not selected when writing to the second block is performed is set to a fourth voltage higher than the third voltage in writing of the second block.

9. The semiconductor memory device according to claim 2, wherein a program verify level of the memory cells of the second block is lower than a program verify level of the memory cells of the first block.

10. A semiconductor memory device, comprising:
a plurality of memory cells which are connected to a bit line, a word line, and a source line;
a first block which includes a plurality of first bit lines to each of which M number of memory cells (M is an integer of two or greater) among the memory cells are connected;
a second block which includes a plurality of second bit lines to each of which N number of memory cells (N is an integer of two or greater satisfying M>N) among the memory cells are connected;

a write circuit which selects P number of memory cells (P is an integer of two or greater) among the memory cells and performs writing at once in writing of the first block and selects Q number of memory cells (Q is an integer of two or greater satisfying P>Q) among the memory cells and performs writing at once in writing of the second block; and a source line control circuit which supplies a first voltage to the source line of the first block and the source line of the second block in writing of the first block, supplies the first voltage to the source line of the first block in writing of the second block, and supplies a second voltage different from the first voltage to the source line of the second block in writing of the second block.

11. The semiconductor memory device according to claim 10, wherein the second voltage is higher than the first voltage.

12. The semiconductor memory device according to claim 11, wherein the plurality of memory cells of the first block are connected in common to a first source line and the plurality of memory cells of the second block are connected in common to a second source line.

13. The semiconductor memory device according to claim 11, wherein the memory cells are electrically rewritable non-volatile memory cells.

14. The semiconductor memory device according to claim 12, wherein the plurality of memory cells of the first block are disposed in a first well, the plurality of memory cells of the second block are disposed in a second well, and erasure is performed at once in each of the blocks.

15. The semiconductor memory device according to claim 13, wherein the memory cells are memory cells using P-channel type transistors.

16. The semiconductor memory device according to claim 10, wherein the first block is a code storage memory area storing control codes and the second block is a work memory area storing work data.

17. The semiconductor memory device according to claim 11, wherein the word line which is not selected when writing to the first block is performed is set to a third voltage in writing of the first block, and the word line which is not selected when writing to the second block is performed is set to a fourth voltage higher than the third voltage in writing of the second block.

18. The semiconductor memory device according to claim 11, wherein a program verify level of the memory cells of the second block is lower than a program verify level of the memory cells of the first block.

* * * * *